(12) United States Patent
Liu et al.

(10) Patent No.: US 6,466,474 B1
(45) Date of Patent: Oct. 15, 2002

(54) MEMORY MODULE HAVING A TWO-TRANSISTOR MEMORY CELL

(75) Inventors: Chih-Cheng Liu, Pan-Chiao (TW); De-Yuan Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/682,399

(22) Filed: Aug. 30, 2001

(51) Int. Cl.$^7$ ................................. G11C 11/24
(52) U.S. Cl. ........................ 365/149; 365/187
(58) Field of Search ................ 365/149, 187, 365/188

(56) References Cited

U.S. PATENT DOCUMENTS 5,870,329 A * 2/1999 Foss ......................... 257/908
6,016,268 A * 1/2000 Worley ...................... 365/149

* cited by examiner

*Primary Examiner*—A. Zarabian
(74) *Attorney, Agent, or Firm*—Winston Hsu

(57) ABSTRACT

A memory module stores digital data. The memory module has many memory cells biased by a voltage source. Each memory cell has an access transistor electrically connected to a word line and a bit line for receiving bits from the bit line when the word line turns on the access transistor, a switching circuit electrically connected to the access transistor, and a capacitor electrically connected to the switching circuit. The switching circuit turns on or off according to the bit from the access transistor. The capacitor stores charge supplied by the switching circuit when the switching circuit turns on. The capacitor stores charge supplied by the voltage source when the switching circuit turns off. When the access transistor turns off, the switching circuit or the voltage source provides charge to the capacitor to sustain the voltage level of the capacitor to compensate for charge leakage of the capacitor.

4 Claims, 2 Drawing Sheets

MEMORY MODULE HAVING A TWO-TRANSISTOR MEMORY CELL

BACKGROUND OF INVENTION

1. Field of the Invention

The present invention relates to a memory module, and more particularly, to a memory module with a simple structure that uses capacitors for storing data without refreshing.

2. Description of the Prior Art

With a development of an information industry, computer systems used for handling a great quantity of data are very popular in a broad spectrum of fields. An ability to deal with digital data makes the computer systems powerful. Not only personal digital assistants (PDA), portable computers, and personal computers for personal uses, but central control systems and switches for controlling the data of multiple users, all make use of the powerful computer systems. Aside from a central processing unit (CPU), a memory module, which helps the CPU operate more quickly, is a key factor for improving an efficiency of the computer system. When the computer system operates, the memory module stores the digital data and program codes, so that the CPU accesses the required data more quickly. Thus, the computer system operates more efficiently.

Please refer to FIG. 1, which is a circuit diagram of a memory module according to the prior art. The memory module 10 is a dynamic random access memory (DRAM) comprising a plurality of memory cells (in FIG. 1, only six memory cells A1–A6 are shown). Corresponding to a placement of the memory cells are two parallel word lines PWL1 and PWL2, running from top to bottom and used to connect with the memory cells. The word line PWL1 is electrically connected to memory cells A1, A3, and A5. Similarly, the word line PWL2 is electrically connected to memory cells A2, A4, and A6. Three parallel bit lines PBL1, PBL2 and PBL3 run from left to right, and are used to connect with the memory cells. The bit line PBL1 is electronically connected to memory cells A1 and A2. Similarly, the bit line PBL2 is electronically connected to memory cells A3 and A4. The bit line PBL3 is electronically connected to memory cells A5 and A6. The address circuit 12 controls each word line, and the bit access circuit 14 controls each bit line. The retrieve circuit 16 reads the data stored in the memory cells A1–A6.

In the memory module 10, the structure of each memory cell is the same. The memory cell is capable of storing one bit of the digital data. Taking the memory cell A1 for example, the memory cell A1 according to the prior art comprises an access transistor Q1 and a capacitor C0 for storing charge. The access transistor Q1 is a metal-oxide-semiconductor (MOS) transistor. A gate of the access transistor Q1 is electrically connected to the word line at a node PN1, and a drain and a source of the access transistor Q1 are electrically connected between the bit line and the capacitor C0.

Operation of the memory module 10 is illustrated as follows. When the memory module stores one bit of the digital data into the memory cell A1, the address circuit 12 increases the voltage of the word line PWL1, which is electrically connected to the memory cell A1, thereby turning on the access transistor. Simultaneously, the voltage of other word lines maintains a low level. Therefore, only the transistors of memory cells A3 and A5, electronically connected to the same word line PWL1, are capable of conducting current. The bit access circuit 14 stores charge into the capacitor C0 of the memory cell A1 via the bit line PBL1. The quantity of charge stored on the capacitor C0 determines the logic value represented by the memory cell. For example, if the memory module stores logic "1" into the memory cell, the bit access circuit 14 increases the voltage of the corresponding bit line, so that the charge can flow into the capacitor via the bit line and the conducting access transistor. On the contrary, if the memory module stores logic "0" into the memory cell, the bit access circuit 14 decreases the voltage of the corresponding bit line, so that the capacitor decreases its charge capacity by discharging via the conducting access transistor and the bit line. The small quantity of charge stored on the capacitor represents logic "0".

When the memory module 10 reads one bit from a certain memory cell, the high voltage of the word line corresponding to the memory cell makes the access transistor conduct current. The retrieve circuit 16 detects the quantity of charge via the bit line and the conducting access transistor to retrieve the data. When the memory cell is storing the data, the access transistor turns off to break the connection between the capacitor and the word line until a next access begins.

As discussed above, the memory module 10 according to the prior art uses the charge stored in the capacitor to represent the logic value stored in the memory cell. Using the capacitor simplifies the circuit design of each memory cell, so as to decrease the area required for the circuit layout, and increases the density of the memory modules. However, when the memory module according to the prior art stores charge and the data, that is, when the capacitor is not electronically connected to the bit line, it is inevitable that charge leakage occurs. The charge leakage affects the quantity of charge stored in the capacitor and results in storing wrong data.

The prior art adopts a refresh operation for the memory module to recharge the capacitors. The access transistor of the memory cell conducts current during each refresh cycle, and the retrieve circuit 26, or the bit access circuit 24, supplies the capacitor with charge via the corresponding bit line. Nevertheless, the refresh operation makes control clocks and related circuitry very complicated. It is difficult to manufacture and use the memory module according to the prior art. Additionally, if the refresh cycle is too short, the repeated refresh operation interferes with normal access of the memory module. If the refresh cycle is too long, the charge leakage occurs continuously, so that the memory module is not capable of sustaining the correct data.

SUMMARY OF INVENTION

It is therefore a primary objective of the present invention to provide a memory module with two transistors to solve the above-mentioned problem.

Briefly, the claimed invention provides a memory module for storing digital data. The memory module comprises a plurality of memory cells, and a voltage source for biasing the memory cells. Each of the memory cells comprises an access transistor electronically connected to a word line and a bit line for receiving bits from the bit line when the word line turns on the access transistor. Each memory cell also comprises a switching circuit electronically connected to the access transistor, and a capacitor electronically connected to the switching circuit. The switching circuit turns on or off according to the bit data of the access transistor. The capacitor stores charge supplied by the switching circuit when the switching circuit turns on. On the contrary, the capacitor stores charge supplied by the voltage source when the switching circuit turns off. When the access transistor turns off, the switching circuit or the voltage source provides charge to the capacitor, so as to sustain the voltage level of the capacitor to compensate for charge leakage of the capacitor.

It is an advantage of the present invention that each memory cell can store data without refreshing a whole memory module.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
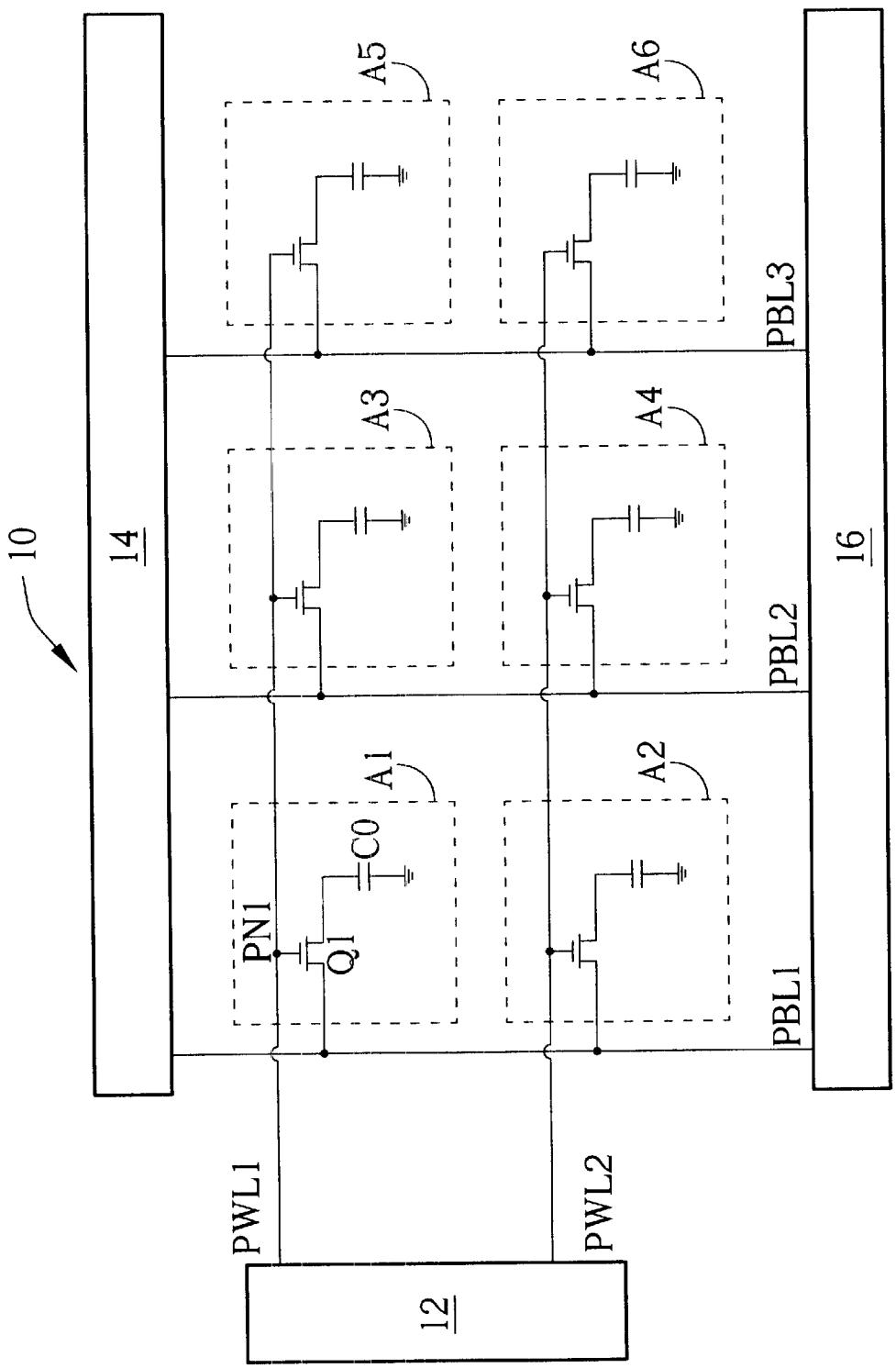
FIG. 1 is a circuit diagram of a memory module according to the prior art.
Figure 2:
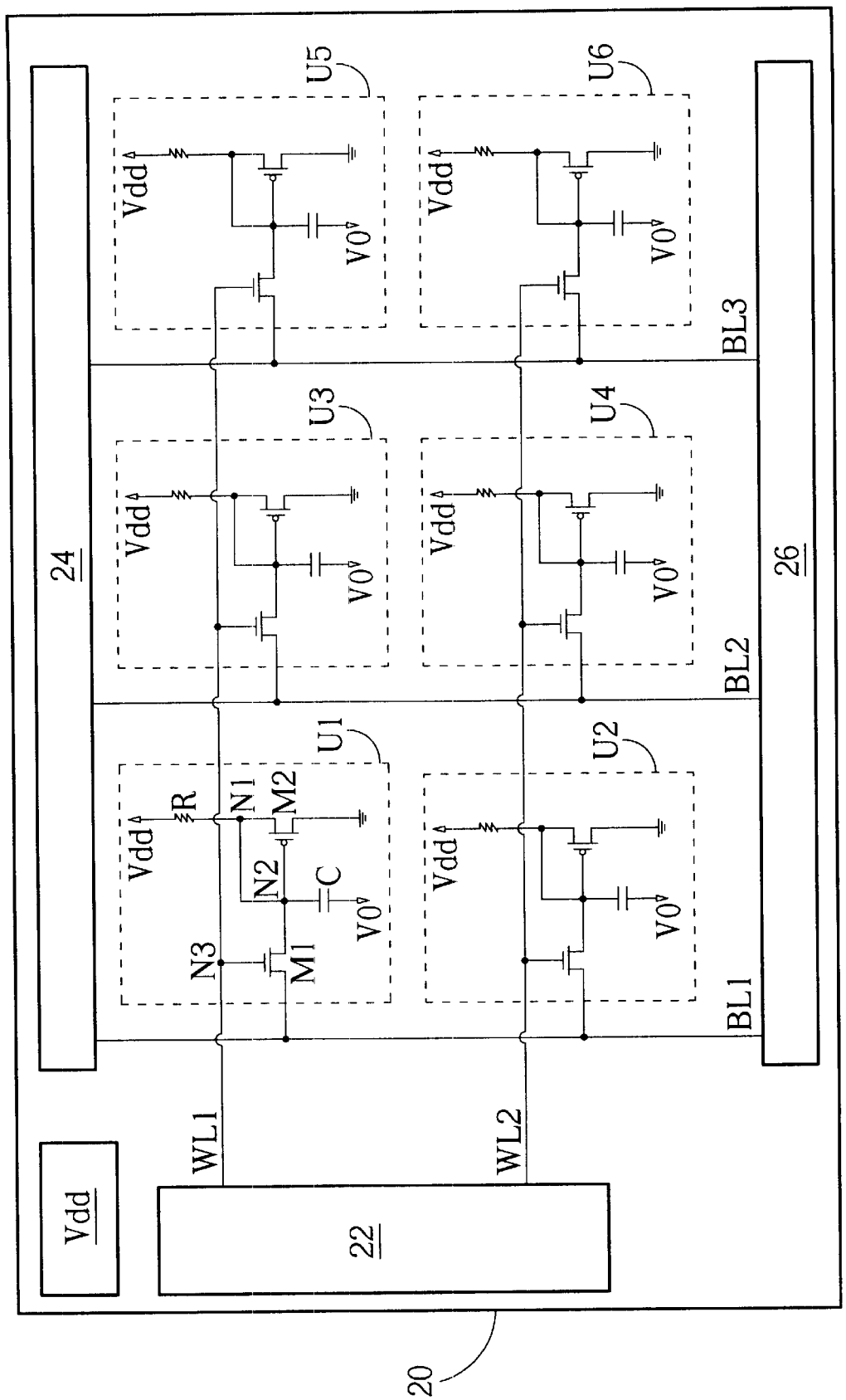
FIG. 2 is a circuit diagram of a memory module according to the present invention.

Please refer to FIG. 2, which is a circuit diagram of a memory module 20 according to the present invention. The memory module 20 has a plurality of memory cells. In FIG. 2, only six memory cells (U1~U6) are shown for simplicity. Nevertheless, the simplified drawing does not affect the disclosure of the present invention. The technique according to the present invention could most certainly be expanded for use with memory modules having more memory cells. In FIG. 2, the memory cells are arranged side by side in array form. The memory module 20 also has one word line WL1 electrically connected with parallel memory cells U1, U3, and U5. Similarly, a word line WL2 is electrically connected with parallel memory cells U2, U4, and U6. In the perpendicular direction, a bit line BL1 is connected with parallel memory cells U1 and U2. A bit line BL2 is connected with parallel memory cells U3 and U4. Similarly, a bit line BL3 is connected with parallel memory cells U5 and U6. An address circuit 22 controls the word lines WL1 and WL2, and a bit access circuit 24 controls the bit lines BL1, BL2, and BL3. A voltage source Vdd of the memory module 20 biases the memory cells. A retrieve circuit 26 electrically connected with each bit line is used for retrieving the data stored in each memory cell.

Each memory cell U1~U6 in the memory module 20 has the same structure. Each of the memory cells is capable of storing one bit of the digital data. For example, the memory cell U1 comprises an access transistor M1, a resistor R, a capacitor C0 for storing charge, and a transistor M2 representing a switching circuit. In the preferred embodiment, a switching circuit M2 is a p-type metal-oxide-semiconductor (PMOS) transistor. A gate of the access transistor M1 is electrically connected to the word line at a node N3, and a source and a drain of the access transistor M1 are electrically connected between the bit line and the switching circuit M2. A gate of the switching circuit M2 is electrically connected to the access transistor M1 at a node N2, and a drain and a source of the switching circuit M2 are electrically connected between ground and the resistor R. Another end of the resistor R is electrically connected to the voltage source Vdd. The detailed connection between the resistor R and the voltage source Vdd is not shown in FIG. 2 for a better disclosure. One end of the capacitor C is electonically connected to the access transistor M1 at the node N2, and the other end is electronically connected to the reference voltage V0. In the preferred embodiment, the reference voltage V0 is half of the voltage Vcc, and the resistor R has a high resistance (made by polycrystalline silicon).

Operation of the memory module 20 according to the present invention is illustrated as follows. When the memory module stores one bit of the data into one memory cell (for example, the memory cell U1), the address circuit 22 increase the voltage of the corresponding word line (that is, word line WL1) so as to turn on the access transistor M1. Then, the corresponding bit line (that is, the bit line BL1) is electrically connected to the switching circuit M2 through the access transistor M1. If the bit being stored is logic "1", the bit access circuit 24 increases the voltage of the bit line (that is, bit line BL1) corresponding to the memory cell to be equal with the voltage Vcc. The voltage at the node N2, therefore, increases and the voltage between the source and the gate is reverse biased, so that the switching circuit M2 turns off. The voltage source Vdd charges the capacitor via the resistor R, the node N1, and the node N2 until the charge stored in the capacitor is stable and the voltage at the node N1 substantially equals the voltage of the voltage source Vdd. Now, the capacitor C has stored more charge for representing logic "1". The resistor R has a high resistance to decrease the current provided by the voltage source Vdd. On the contrary, if the bit being stored is logic "0", the bit access circuit 24 decreases the voltage of the corresponding bit line. The voltage at the node N2, therefore, decreases and the switching circuit M2 turns on. The voltage at the node N2 decreases via the conducting switching circuit M2 to be equal with ground. Now, the capacitor C has stored much less charge for representing logic "0". Similarly, when the memory module 20 wants to retrieve the data from one memory cell, the corresponding word line causes the access transistor to conduct current, so that the capacitor of the memory cell is electrically connected to the corresponding bit line. The retrieve circuit 26 of the memory module 20 can detect the quantity of charge stored in the capacitor via the corresponding bit line and retrieves the corresponding information from the quantity of charge.

When the memory cell is holding the stored data without being accessed, the access transistor of the memory cell turns off, so that the node N2 is not electrically connected to the corresponding bit line. Now, the active parts of the memory cell, including the voltage source Vdd and the switching circuit M2, dynamically compensate for charge leakage of the capacitor and stabilize the charge stored in the capacitor. Therefore, the present invention does not refresh the memory module as the prior art does. In the interval of holding data according to the present invention, if one memory cell stores logic "1", the voltage source Vdd continuously charges the capacitor for maintaining a high quantity of charge across the capacitor even when the charge stored in the capacitor is leaking. On the contrary, if one memory cell, taking the memory cell U1 for example, stores logic "0", the conducting switching circuit stabilizes the charge stored in the capacitor. With the movement of the charge stored in the capacitor, the voltage at the node N2 might shift, so that the gate voltage of the switching circuit changes. Then, the current flowing through the switching circuit M2 varies, and the variation of the current feeds back to the node N2 via the node N1. Finally, the voltage of the capacitor C at the node N2 is stabilized. Each of the memory cells of the memory module according to the present invention is capable of compensating for charge leakage of the capacitor without refreshing the whole memory module periodically as the prior art does.

To sum up, the access transistor of each memory cell of the memory module according to the prior art turns off for holding data. However, the capacitor used to store data is continuously discharging. The memory module according to the prior art, therefore, needs to turn on the access transistor again to compensate for charge leakage of the capacitor each refresh cycle.

In contrast to the prior art, the memory cell of the memory module according to the present invention uses the capacitor, which has a simple structure and is easy to implement, for storing data. However, the active parts of the memory cell according to the present invention are capable of compensating for charge leakage of the capacitor without refreshing the memory module as the prior art does when the access transistor turns off. Each memory cell according to the present invention has a simple structure, so that the capacity of the memory cells increases, and the memory module needs not refresh periodically as the prior art does. Actually, the memory module according to the present invention does not require complicated control clocks, so that the production cost further decreases.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A memory module for storing digital data, the memory module comprising:

a plurality of memory cells, each of the memory cells being capable of storing one bit of the digital data; and a voltage source for biasing the memory cells;

each of the memory cells comprising:

an access transistor electrically connected to a word line and a bit line for receiving the bit from the bit line when the word line turns on the access transistor;

a switching circuit electrically connected to the access transistor, wherein the switching circuit turns on or off according to the bit from the access transistor; and a capacitor electrically connected to the switching circuit, wherein the capacitor stores charge supplied by the switching circuit when the switching circuit turns on; and the capacitor stores charge supplied by the voltage source when the switching circuit turns off;

wherein when the access transistor turns off, the switching circuit or the voltage source provides charge to the capacitor so as to maintain a voltage level of the capacitor to compensate for charge leakage of the capacitor.

2. The memory module of claim 1, wherein the switching circuit is a PMOS (P-type metal-oxide-semiconductor transistor) having a gate, a source and a drain, the gate electrically connected to the access transistor such that the switching circuit turns on or off according to the bit from the access transistor.

3. The memory module of claim 1, wherein the memory module further comprises a resistor electrically connected between the voltage source and the switching circuit to serve as an electrical load for the switching circuit.

4. The memory module of claim 3, wherein the resistor has a high resistance.

* * * * *